United States Patent
Wang et al.

(10) Patent No.: US 12,183,616 B2
(45) Date of Patent: Dec. 31, 2024

(54) METHOD AND SYSTEM FOR POSITIONING CENTER OF V-TYPE NOTCH OF WAFER, AND COMPUTER STORAGE MEDIUM

(71) Applicants: XI'AN ESWIN MATERIAL TECHNOLOGY CO., LTD., Xi'an (CN); XI'AN ESWIN SILICON WAFER TECHNOLOGY CO., LTD., Xi'an (CN)

(72) Inventors: Leilei Wang, Xi'an (CN); Xun Lan, Xi'an (CN); Housheng Li, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., LTD., Xi'an (CN)

(*) Notice: Subject to any disclaimer, the term of this patent is extended or adjusted under 35 U.S.C. 154(b) by 0 days.

(21) Appl. No.: 18/568,629

(22) PCT Filed: Oct. 21, 2022

(86) PCT No.: PCT/CN2022/126620
§ 371 (c)(1),
(2) Date: Dec. 8, 2023

(87) PCT Pub. No.: WO2023/066366
PCT Pub. Date: Apr. 27, 2023

(65) Prior Publication Data
US 2024/0266198 A1    Aug. 8, 2024

(30) Foreign Application Priority Data
Oct. 21, 2021  (CN) .......................... 202111228898.4

(51) Int. Cl.
*G01B 11/27* (2006.01)
*H01L 21/68* (2006.01)
*H01L 21/683* (2006.01)

(52) U.S. Cl.
CPC .......... *H01L 21/681* (2013.01); *G01B 11/272* (2013.01); *H01L 21/6838* (2013.01)

(58) Field of Classification Search
CPC .. H01L 21/681; H01L 21/6838; G01B 11/272
(Continued)

(56) References Cited

U.S. PATENT DOCUMENTS 4,887,904 A * 12/1989 Nakazato .............. H01L 21/681
  414/757
5,438,209 A *  8/1995 Yamamoto ............ H01L 21/681
  250/548

(Continued)

FOREIGN PATENT DOCUMENTS

| CN | 1787200 A | 6/2006 |
| CN | 103199046 A | 7/2013 |

(Continued)

OTHER PUBLICATIONS

Korean Office Action corresponding to Korean Application No. 10-2023-7042887, dated Apr. 5, 2024. (5 pages).

(Continued)

*Primary Examiner* — Isiaka O Akanbi
(74) *Attorney, Agent, or Firm* — Maginot, Moore & Beck LLP (57) ABSTRACT

A method is for positioning a center of a V-type notch of a wafer. The method includes: determining, based on collected edge data of a V-type notch of a wafer, a center of a concentric circle corresponding to edges of the V-type notch; and judging, based on a position relation between the center and a set reference scale line, whether the V-type notch is at (Continued)

a preset target center position. The method also includes determining, based on the position relation between the center and the set reference scale line, a rotation direction and rotation angle of the wafer when the V-type notch is out of the preset target center position; and driving, according to the rotation direction and rotation angle of the wafer, the wafer to rotate until the V-type notch is rotated to the preset target center position.

7 Claims, 7 Drawing Sheets

(58) Field of Classification Search
USPC .................................................. 356/399, 401
See application file for complete search history.

(56) References Cited

U.S. PATENT DOCUMENTS

| | | | |
|---|---|---|---|
| 6,836,690 | B1 | 12/2004 | Spady et al. |
| 11,315,817 | B2* | 4/2022 | Kim ................. H01L 21/67706 |
| 2005/0078312 | A1* | 4/2005 | Fukuzaki ............. H01L 21/682 |
| | | | 356/399 |
| 2005/0105102 | A1* | 5/2005 | Nguyen ................ G01B 11/00 |
| | | | 356/620 |
| 2006/0169208 | A1 | 8/2006 | Shinozaki et al. |
| 2006/0222236 | A1* | 10/2006 | Osada .................. H01L 21/681 |
| | | | 382/151 |
| 2009/0189054 | A1* | 7/2009 | Campidell ........ H01L 21/67282 |
| | | | 250/206 |
| 2010/0132205 | A1* | 6/2010 | Kobayashi ........ H01L 21/76251 |
| | | | 33/1 N |
| 2014/0081457 | A1* | 3/2014 | Kobayashi ............ H01L 21/681 |
| | | | 700/254 |
| 2015/0009498 | A1* | 1/2015 | Zell ...................... G01B 11/272 |
| | | | 356/399 |
| 2017/0301571 | A1* | 10/2017 | Tsuchiya ............. H01L 21/6836 |
| 2021/0098274 | A1* | 4/2021 | Kim .................. H01L 21/68707 |
| 2022/0379428 | A1* | 12/2022 | Zhang ................ H01L 21/3212 |

FOREIGN PATENT DOCUMENTS

| | | | |
|---|---|---|---|
| CN | 103199048 | A | 7/2013 |
| CN | 103206916 | A | 7/2013 |
| CN | 103234991 | A | 8/2013 |
| CN | 110712309 | A | 1/2020 |
| CN | 113327863 | A | 8/2021 |
| CN | 113658901 | A | 11/2021 |
| JP | H08339947 | A | 12/1996 |
| JP | H1070173 | A | 3/1998 |
| JP | 2003152055 | A | 5/2003 |
| JP | 2005093807 | A | 4/2005 |
| JP | 2006287181 | A | 10/2006 |
| JP | 2009529248 | A | 8/2009 |
| JP | 2014117782 | A | 6/2014 |
| JP | 2015195314 | A | 11/2015 |
| JP | 2016192462 | A | 11/2016 |
| JP | 2018137270 | A | 8/2018 |
| KR | 20060088817 | A | 8/2006 |
| KR | 20110056841 | A | 5/2011 |

OTHER PUBLICATIONS

English Translation of Korean Office Action corresponding to Korean Application No. 10-2023-7042887, dated Apr. 5, 2024. (5 pages).
Written Opinion and International Search Report of the International Search Authority corresponding to International Application No. PCT/CN2022/126620, dated Jan. 18, 2023. (8 pages).
English Translation of Written Opinion and International Search Report of the International Search Authority corresponding to International Application No. PCT/CN2022/126620, dated Jan. 18, 2023. (4 pages).
English Translation of CN103206916A. (13 Pages).
English Translation of CN103234991A. (7 Pages).
English Translation of CN110712309A. (17 Pages).
English Translation of CN113327863A. (15 Pages).
English Translation of CN113658901A. (21 Pages).
Chinese Office Action corresponding to Chinese Patent Application No. 202111228898.4, dated Dec. 1, 2021. (7 Pages).
English Translation of Chinese Office Action corresponding to Chinese Patent Application No. 202111228898.4, dated Dec. 1, 2021. (4 Pages).
English Translation of CN103199048A. (13 Pages).
English Translation of CN1787200A. (12 Pages).
English Translation of CN103199046A. (9 Pages).
Japanese Office Action corresponding to Japanese Application No. 2023-576176, dated Jul. 9, 2024. (4 pages).
English Translation of Japanese Office Action corresponding to Japanese Application No. 2023-576176, dated Jul. 9, 2024. (4 pages).
English Translation of JP2015195314A. (29 Pages).
English Translation of JP2016192462A. (40 Pages).
English Translation of JP2018137270A. (28 Pages).
English Translation of JPH1070173A. (8 Pages).
English Translation of JPH08339947A. (27 Pages).
English Translation of KR20110056841A. (10 Pages).
English Translation of JP2003152055A. (21 Pages).
English Translation of JP2005093807A. (21 Pages).
English Translation of JP2006287181A. (79 Pages).
English Translation of JP2014117782A. (28 Pages).
English Translation of JP2009529248A. (15 Pages).

* cited by examiner

METHOD AND SYSTEM FOR POSITIONING CENTER OF V-TYPE NOTCH OF WAFER, AND COMPUTER STORAGE MEDIUM

CROSS-REFERENCE TO RELATED APPLICATION

The present application is the U.S. national phase of PCT Application No. PCT/CN2022/126620 filed on Oct. 21, 2022, which claims priority to the Chinese patent application No. 202111228898.4 filed in China on Oct. 21, 2021, a disclosure of which is incorporated herein by reference in its entirety.

TECHNICAL FIELD

The present disclosure relates to the field of semiconductor technologies, in particular to a method and system for positioning a center of a V-type notch of a wafer, and a computer storage medium.

BACKGROUND

In the semiconductor industry, after a monocrystalline silicon ingot is pulled and its surface ground, according to product requirements, technicians process a flat edge or a V-type notch on a specific crystal orientation (hereinafter referred to as "Orientation") of the monocrystalline silicon ingot. This is used to determine the specific crystal orientation of a wafer made from the monocrystalline silicon ingot, so as to facilitate an integrated circuit (IC) factory to identify and locate the specific crystal orientation of the wafer. However, the processing of the flat edge on an edge of the wafer may affect a utilization rate of the wafer, so currently, wafers with a diameter of more than 200 mm no longer use the flat edge to locate their specific crystal orientation, but a V-type notch with a depth of 1.0 mm to 1.05 mm and an angle of 90 degrees is processed on the edge of the wafer. This V-type notch is also referred to as the V-Notch.

SUMMARY

In a first aspect, an embodiment of the present disclosure provides a method for positioning a center of a V-type notch of a wafer, comprising:
  determining, based on collected edge data of the V-type notch of the wafer, a center of a concentric circle corresponding to edges of the V-type notch;
  judging, based on a position relation between the center and a preset reference scale line, whether the V-type notch is at a preset target center position;
  determining, based on the position relation between the center and the set reference scale line, a rotation direction and rotation angle of the wafer when the V-type notch is out of the preset target center position;
  driving, according to the rotation direction and rotation angle of the wafer, the wafer to rotate until the V-type notch is rotated to the preset target center position.

In a second aspect, an embodiment of the present disclosure provides a positioning system for a center of a V-type notch of a wafer, comprising: a first determining portion, a judging portion, a second determining portion and a rotating portion; wherein
  the first determining portion is configured to determine, based on collected edge data of the V-type notch of the wafer, a center of a concentric circle corresponding to edges of the V-type notch;
  the judging portion is configured to judge, based on a position relation between the center and a set reference scale line, whether the V-type notch is at a preset target center position;
  the second determining portion is configured to determine, based on the position relation between the center and the set reference scale line, a rotation direction and rotation angle of the wafer when the V-type notch is out of the preset target center position;
  the rotating portion is configured to drive, according to the rotation direction and rotation angle of the wafer, the wafer to rotate until the V-type notch is rotated to the preset target center position.

In a third aspect, an embodiment of the present disclosure provides a system for positioning a center of a V-type notch of a wafer, comprising: a positioning back plate for positioning a wafer with the center of the V-type notch, a vacuum suction cup, a line laser contour detection sensor, a data processing device, and a servo motor; wherein the positioning back plate is provided with a circular hole that cooperates with the vacuum suction cup, and the vacuum suction cup is embedded in the circular hole;
  the vacuum suction cup is used to adsorb the wafer with the back of the wafer tightly attached to the positioning back plate;
  the line laser contour detection sensor is used to collect edge data of the V-type notch;
  the data processing device is configured to:
    determine, based on collected edge data of the V-type notch of the wafer, a center of a concentric circle corresponding to edges of the V-type notch;
    judging, based on a position relation between the center and a preset reference scale line, whether the V-type notch is at a preset target center position;
    determining, based on the position relation between the center and the set reference scale line, a rotation direction and rotation angle of the wafer when the V-type notch is out of the preset target center position; and
    outputting, according to the rotation direction and rotation angle of the wafer, a control signal;
  the servo motor is configured to drive the wafer to rotate clockwise or counterclockwise until the V-type notch is located below the line laser contour detection sensor; and drive, based on the control signal, the wafer to rotate according to the rotation direction and rotation angle of the wafer, until the V-type notch is rotated to the preset target center position.

In a fourth aspect, an embodiment of the present disclosure provides a computer storage medium, storing therein a computer program for positioning a center of a V-type notch of a wafer, wherein the computer program is configured to be executed by at least one processor to implement the steps in the method according to the first aspect.

DETAILED DESCRIPTION

The technical solutions in the embodiments of the present disclosure will be clearly and completely described hereinafter with reference to the accompanying drawings in the embodiments of the present disclosure.

In the related art, since the specific crystal orientation of the monocrystalline silicon ingot is measured by using an X-ray diffractometer at present, and there are errors in the positioning of the V-type notch and the processing of the V-type notch. Therefore, there are deviations between the crystal orientation of the monocrystalline silicon ingot or wafer and a center of the processed V-type notch. In the actual measurement process, a crystal orientation deviation of the V-type notch is used to describe a deviation degree between the center position of the V-type notch and the crystal orientation of the monocrystalline silicon ingot or wafer. The crystal orientation deviation of the V-type notch plays a crucial role in yield and product performance of the subsequent product, so it is very important to accurately measure the crystal orientation deviation of the V-type notch in the production process of the wafer. Understandably, if the crystal orientation deviation of the V-type notch is not accurately measured, the processing pattern on the edge of the wafer will not match the crystal orientation of the wafer, ultimately affecting the electrical performance of the product, and even leading to the scrapping of the product.

Currently, the crystal orientation deviation of the V-type notch in the conventional technical solution is measured by positioning the center of the V-type notch, specifically by using the X-ray diffraction method to measure the crystal orientation deviation degree at a vertical position of the V-type notch to represent the crystal orientation deviation of the V-type notch. However, in the process of positioning the center of the V-type notch, due to the small width and shallow depth of the V-type notch, and the need for technicians to manually install a positioning back plate and wafer, and observe and judge whether the center of the V-type notch of the wafer is aligned with a reference scale line of the positioning back plate, this leads to a large positioning error of the V-type notch, and a measured crystal orientation deviation of the V-type notch is not accurate.

In view of this, embodiments of the present disclosure aim to provide a method and system for positioning a center of a V-type notch of a wafer, and computer storage medium, which is able to reduce the positioning error of the V-type notch, improve the accuracy of the measurement of the crystal orientation deviation of the V-type notch while improve the measurement efficiency and save labor costs.

Figure 1:
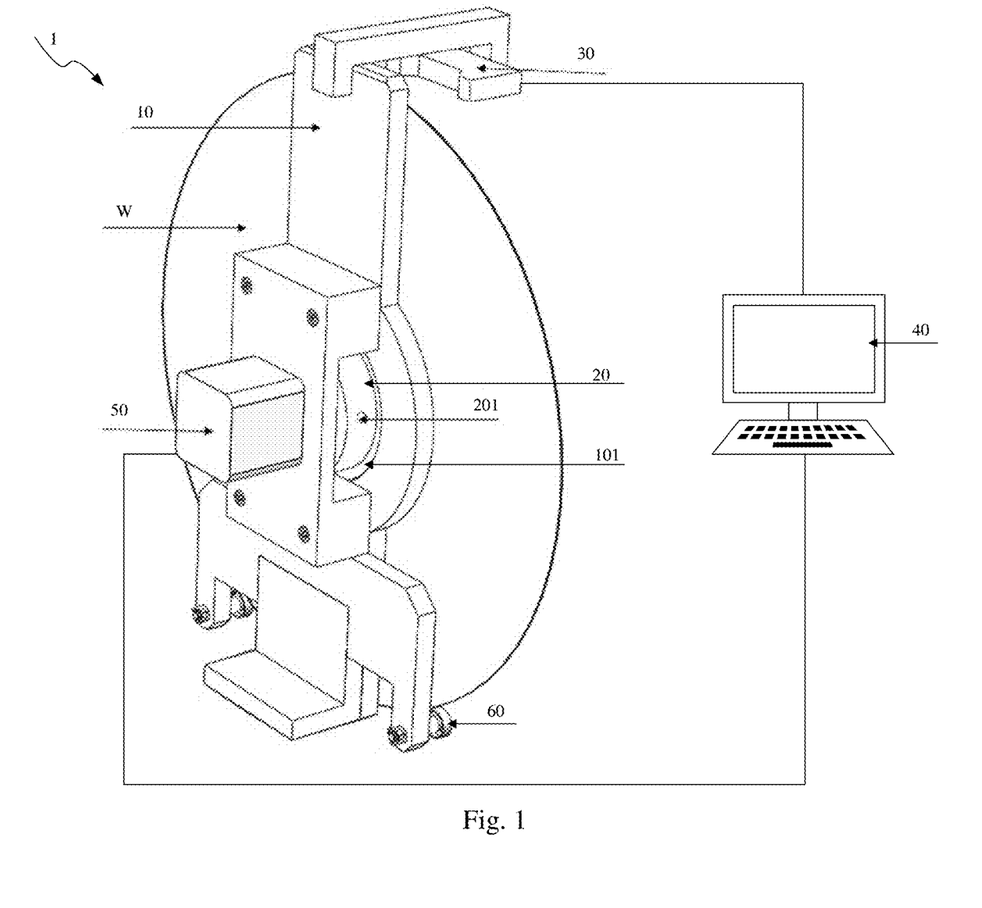
FIG. 1 is a schematic view of a system for positioning a center of a V-type notch of a wafer according to an embodiment of the present disclosure.
Figure 2:
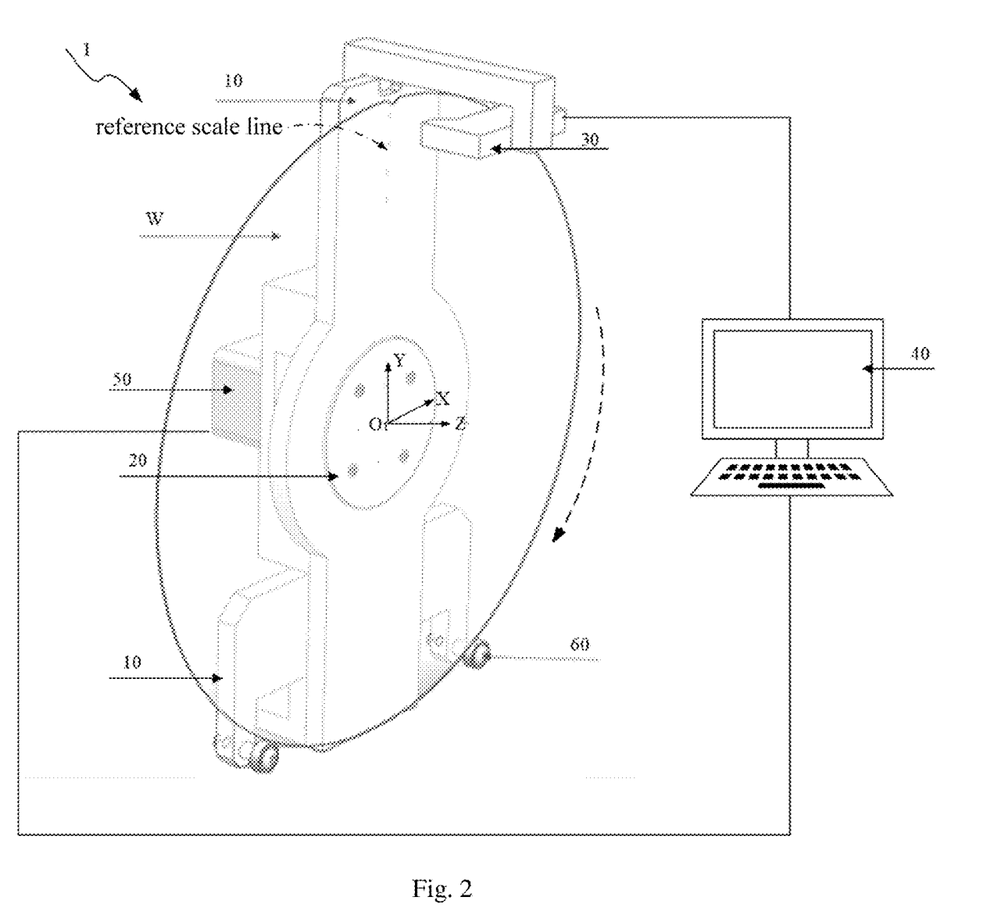
FIG. 2 is another schematic view of a system for positioning a center of a V-type notch of a wafer according to an embodiment of the present disclosure.

Referring to FIG. 1 and FIG. 2, FIG. 1 and FIG. 2 show a system 1 for positioning a center of a V-type notch of a wafer W according to an embodiment of the present disclosure. Combining FIG. 1 and FIG. 2, the system 1 comprises: a positioning back plate 10 for positioning the wafer W with the center of the V-type notch, a vacuum suction cup 20, a line laser contour detection sensor 30, a data processing device 40, and a servo motor 50; wherein the positioning back plate 10 is provided with a circular hole 101 that cooperates with the vacuum suction cup 20, so that the vacuum suction cup 20 is able to be embedded in the circular hole 101;

the vacuum suction cup 20 is used to adsorb the wafer W, so that a back of the wafer W is tightly attached to the positioning back plate 10;

the line laser contour detection sensor 30 is used to collect edge data of the V-type notch of the wafer W;

the data processing device 40 is configured to:

determine, based on collected edge data of the V-type notch of the wafer W, a center of concentric circle corresponding to edges of the V-type notch;

judging, based on a position relation between the center and a set reference scale line, whether the V-type notch is at a preset target center position;

determining, based on the position relation between the center and the set reference scale line, a rotation direction and rotation angle of the wafer W when the V-type notch is out of the preset target center position;

outputting, according to the rotation direction and rotation angle of the wafer W, a control signal; and the servo motor 50 is configured to drive the wafer W to rotate clockwise or counterclockwise so that the V-type notch is located below the line laser contour detection sensor 30; and driving, based on the control signal, the wafer W to rotate according to the rotation direction and rotation angle of the wafer W, so that the V-type notch is rotated to the preset target center position.

It is to be noted that, as shown in FIG. 2, the set reference scale line is arranged on the positioning back plate 10 to facilitate the judgement of whether the center of the V-type notch coincides with the reference scale line.

In addition, in the specific implementation process, as shown in FIG. 1 and FIG. 2, the data processing device 40 capable of processing data can be connected to the line laser contour detection sensor 30, so that steps or tasks other than edge data collection and driving the wafer W to rotate can be implemented through the data processing device 40. For example, the data processing device 40 may specifically be a wireless device, mobile or cellular phone (including so-called smartphones), personal digital assistant (PDA), video game console (including video display, mobile video game device, mobile video conference unit), laptop computer, desktop computer, TV set-top box, tablet computing device, e-book reader, fixed or mobile media player, etc.

Optionally, at least one pair of cam followers 60 are set at a bottom of the positioning back plate 10 for driving the wafer W to rotate clockwise or counterclockwise.

It is to be noted that in the embodiments of the present disclosure, the clockwise rotation direction of the wafer W is indicated by a dashed arrow direction in FIG. 2, and the counterclockwise rotation direction of the wafer W is a direction opposite to the clockwise rotation direction.

For the system 1 shown in FIG. 1 and FIG. 2, when an X-ray diffractometer is used to measure a crystal orientation deviation of the V-type notch of the wafer W, the center of the V-type notch needs to be located by technicians first. The specific operation is to first place an edge of the wafer W with a processed V-type notch facing the line laser contour detection sensor 30, so that when the V-type notch is below the line laser contour detection sensor 30, the line laser contour detection sensor 30 can collect the edge data of the V-type notch. The edge without a processed V-type notch of the wafer W contacts the cam follower 60.

It is to be understood that the vacuum suction cup 20 is equipped with an air pipe interface 201, which is connected to a vacuum pump (not shown). After installation of the wafer W is completed, the vacuum pump is started to form a vacuum environment between the vacuum suction cup 20 and the wafer W, so that the vacuum suction cup 20 can adsorb and fix the wafer W. At the same time, it is be noted that a surface of the vacuum suction cup 20 in contact with the back of the wafer W is flush with a surface of the positioning back plate 10 in contact with the back of the wafer W. In this way, when the vacuum suction cup 20 adsorbs and fixes the wafer W, the back of the wafer W can be tightly attached to the positioning back plate 10, so as to accurately position the center of the V-type notch.

Figure 3:
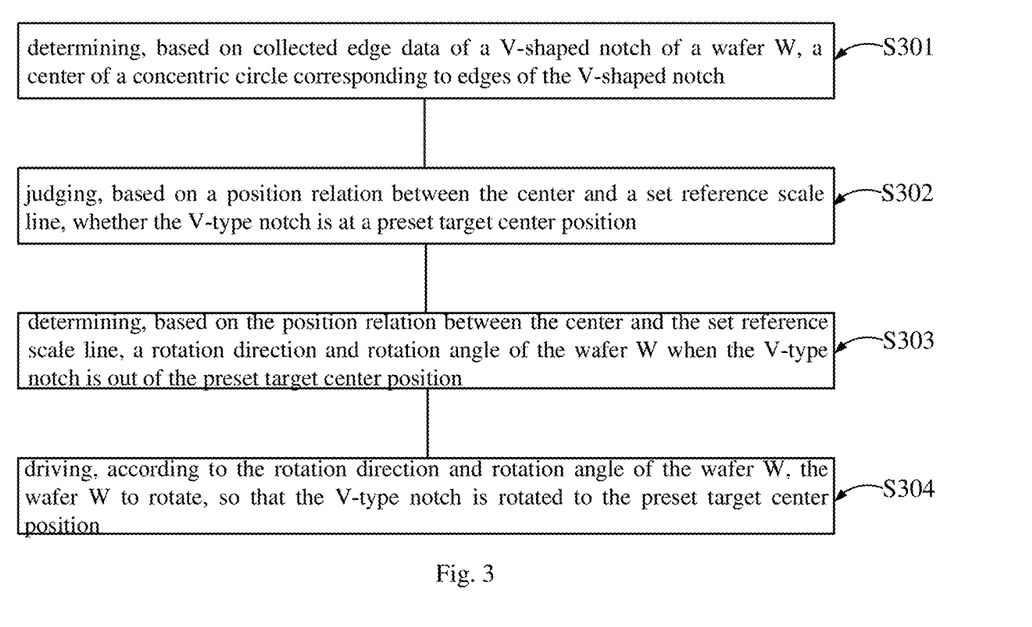
FIG. 3 is a schematic flowchart of a method for positioning a center of a V-type notch of a wafer according to an embodiment of the present disclosure.

Based on the aforementioned system 1, referring to FIG. 3, FIG. 3 shows a method for positioning a center of a V-type notch of a wafer W according to an embodiment of the present disclosure. This method can be applied to the system 1 shown in FIG. 1 and FIG. 2 for positioning the center of the V-type notch. The method comprises:

S301: determining, based on collected edge data of a V-type notch of a wafer W, a center of a concentric circle corresponding to edges of the V-type notch;

S302: judging, based on a position relation between the center and a set reference scale line, whether the V-type notch is at a preset target center position;

S303: determining, based on the position relation between the center and the set reference scale line, a rotation direction and rotation angle of the wafer W when the V-type notch is out of the preset target center position;

S304: driving, according to the rotation direction and rotation angle of the wafer W, the wafer W to rotate, so that the V-type notch is rotated to the preset target center position.

It is to be noted that in the embodiments of the present disclosure, a Cartesian coordinate system as shown in FIG. 2 is established with a center $O_1$ of the wafer W as an origin. Therefore, the coordinates mentioned in the embodiments of the present disclosure are all based on the established Cartesian coordinate system.

For the technical solution shown in FIG. 3, the center of the concentric circle corresponding to the edges of the V-type notch is determined based on the collected edge data of the V-type notch, and whether the V-type notch is at the preset target center position is judged based on the position relation between the center and the set reference scale line. When the V-type notch is out of the preset target center position, the rotation direction and rotation angle of the wafer W are determined based on the position relation between the center and the set reference scale line, and the wafer W is rotated according to the rotation direction and rotation angle of the wafer W, so that the V-type notch is rotated to the preset target center position. This method can reduce positioning errors, improve accuracy of measurement results, save labor costs, and improve production efficiency.

For the technical solution shown in FIG. 3, in some examples, the determining, based on the collected edge data of the V-type notch of the wafer W, the center of the concentric circle corresponding to the edges of the V-type notch comprises:

rotating the wafer W so that the V-type notch is rotated to below a line laser contour detection sensor 30 (as shown in FIG. 1 and FIG. 2);

using the line laser contour detection sensor 30 to collect coordinates of each edge point of the V-type notch;

using a least squares method to obtain, based on the coordinates of each edge point, coordinate $(X_O, Y_O)$ of the center O of the concentric circle corresponding to the edges of the V-type notch.

Figure 4:
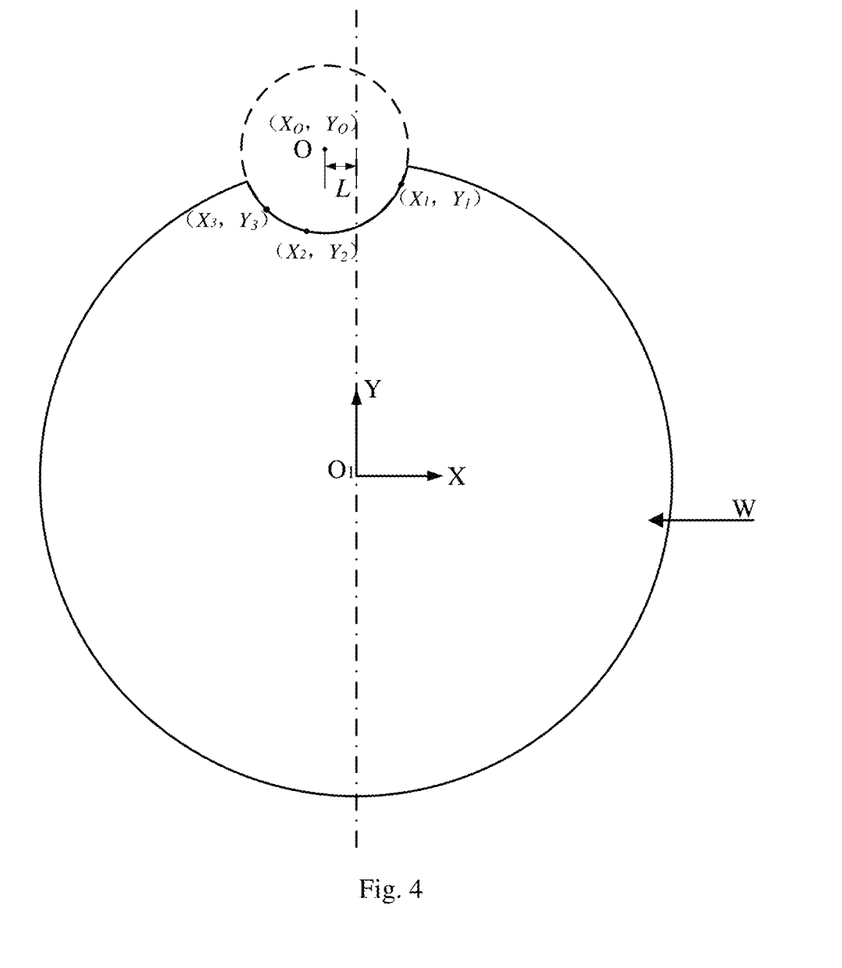
FIG. 4 is a schematic view of a shape of a V-type notch of a wafer according to an embodiment of the present disclosure.
Figure 5:
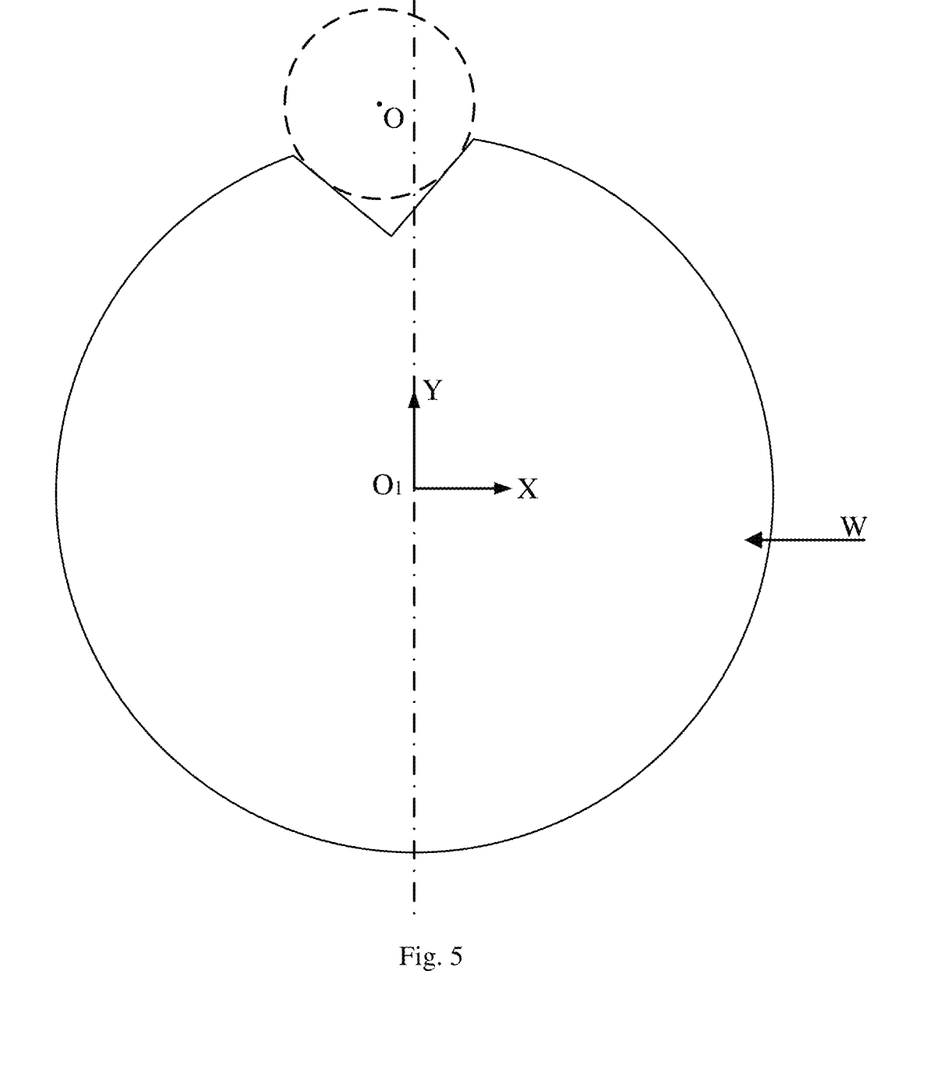
FIG. 5 is a schematic view of another shape of a V-type notch of a wafer according to an embodiment of the present disclosure.

It is to be noted that, as shown in FIG. 4, when a bottom of the V-type notch is arc-type, the foregoing concentric circle corresponding to the edges of the V-type notch is a concentric circle corresponding to the arc at the bottom edge of the V-type notch. On the other hand, as shown in FIG. 5, when a contour of the V-type notch is conical, the foregoing concentric circle corresponding to the edges of the V-type notch is a tangent circle of the edges of the V-type notch.

Optionally, for the above example, in some specific implementation methods, the using the least squares method to obtain, based on the coordinates of each edge point, the coordinate $(X_O, Y_O)$ of the center O of the concentric circle corresponding to the edge of the V-type notch, comprises:

selecting three non-repeating edge points and using the least squares method to fit and obtain, based on the coordinates of the three non-repeating edge points, the coordinate $(X_O, Y_O)$ of the center O corresponding to the edge of the V-type notch.

It is to be understood that after the coordinates of the three non-repeating edge points are obtained, the coordinate $(X_O, Y_O)$ of the center of the corresponding concentric circle can be fitted and obtained. Generally, the least squares method can be used to fit the center coordinates, and the mathematical equation used for fitting is the circle equation, which is shown in equation (1):

$$(X - X_O)^2 + (Y - Y_O)^2 = r^2 \qquad (1)$$

where (X, Y) is coordinate of an edge point of the V-type notch, $(X_O, Y_O)$ is the coordinate of the center of the concentric circle to be fitted, and r is a radius of the concentric circle to be fitted.

After expanding the fitting equation shown in equation (1), an equation in the form of equation (2) is obtained:

$$X^2 - 2X \times X_O + 2X_O^2 + Y^2 - 2Y \times Y_O + 2Y_O^2 = r^2 \qquad (2)$$

Equation (2) has three unknowns r, $X_O$ and $Y_O$. Therefore, based on the coordinates of the three determined edge points, such as (X1, Y1), (X2, Y2), and (X3, Y3) in FIG. 4, the coordinate of the center O and the radius of the concentric circle can be determined.

For the technical solution shown in FIG. 3, in some examples, the judging, based on the position relation between the center and the set reference scale line, whether the V-type notch is at a preset target center position, comprises:

obtaining a distance L between the center O and the set reference scale line;

determining that the V-type notch is at the preset target center position when the distance L=0 or the distance L is within a preset range;

determining that the V-type notch is out of the preset target center position and continuing positioning operation of the center of the V-type notch, when the distance L is without a preset range;

where the preset range is the distance L=0±0.001 mm between the center O of the concentric circle and the set reference scale line.

It is to be noted that, in combination with FIG. 2 and FIG. 4, in the $XO_1Y$ plane of the Cartesian coordinate system, the reference scale line (indicated by the dotted line in FIG. 4) is parallel to the Y-axis. Therefore, it can be determined that the distance L between the center O and the set reference scale line is equal to the X-axis coordinate value of the center O. It is to be understood that if L is 0 or the L is within a preset range, it can be considered that the center of the V-type notch is at the target center position, that is, it coincides with the reference scale line. At this time, the positioning of the center of the V-type notch ends and the normal crystal orientation measurement of the wafer W begins. If the size of L is without the preset range, it is necessary to rotate the wafer W to continue positioning the center of the V-type notch, so that the center of the V-type notch is rotated to the target center position and is coincided with the reference scale line.

Absolutely, the distance L between the center O and the set reference scale line can also be obtained by actual measurement with a ruler.

For the technical solution shown in FIG. 3, in some examples, the determining, based on the position relation between the center and the set reference scale line, the rotation direction and rotation angle of the wafer W when the V-type notch is out of the preset target center position, comprises:

determining, according to a formula $\theta=180L/\pi D$, a rotation angle $\theta$ of the wafer W based on the distance L between the center O and the set reference scale line and a distance D between the center O and a center $O_1$ of the wafer W, when the V-type notch is out of the preset target center position;

determining, based on the position relation between the center O and the set reference scale line, the rotation direction of the wafer W.

For the foregoing examples, in some specific implementations, the determining, based on the position relation between the center O and the set reference scale line, the rotation direction of the wafer W comprises:

setting, in an $XO_1Y$ plane of a Cartesian coordinate system, the distance L>0 when the center O is located on the right side of the reference scale line, the distance L<0 when the center O is located on the left side of the reference scale line:

determining that the rotation direction of the wafer W is counterclockwise when the distance L>0; or, determining that the rotation direction of the wafer W is clockwise when the distance L<0.

Figure 6:
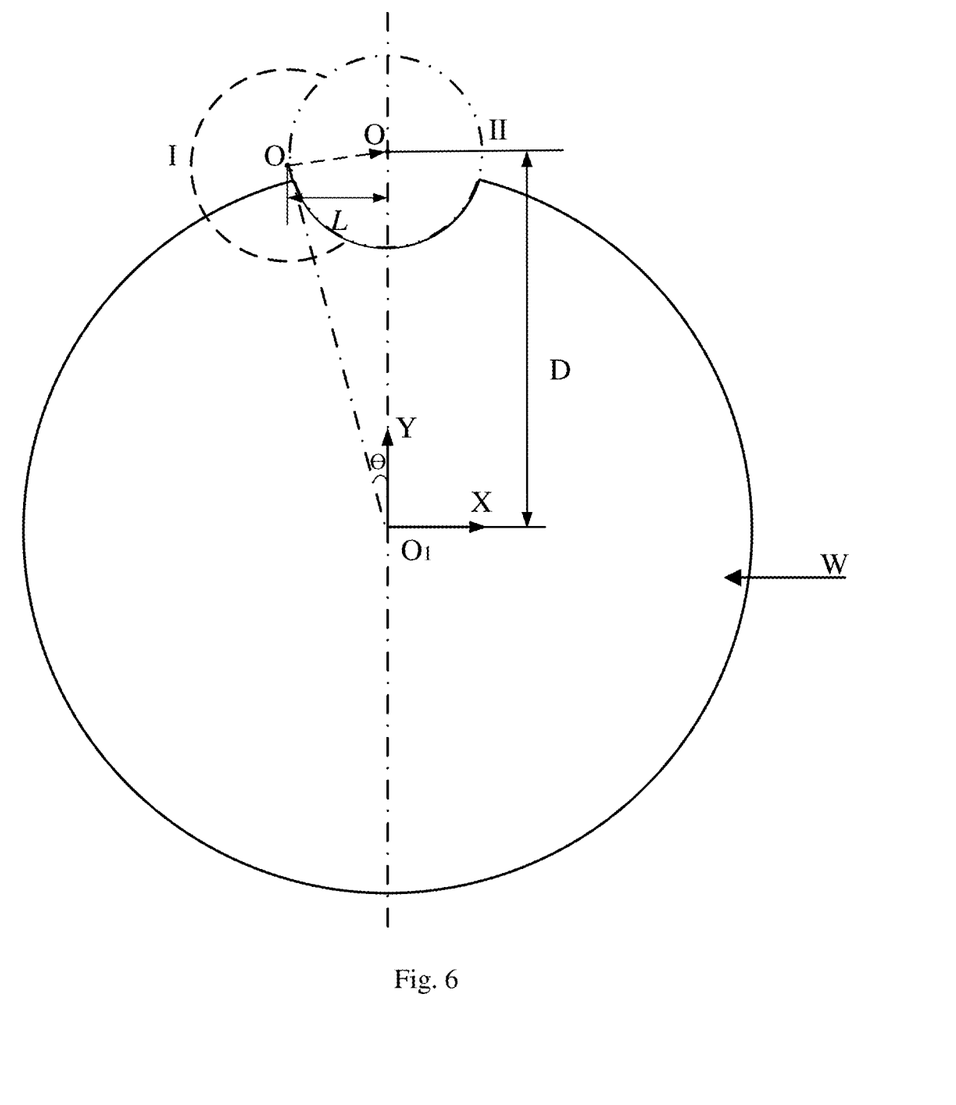
FIG. 6 is a schematic view showing comparison of center positions of a V-type notch before and after a rotation of a wafer according to an embodiment of the present disclosure.

It is to be noted that, as the diameter of the wafer W is relatively large, in the embodiments of the present disclosure, as shown in FIG. 6, L is approximately regarded as the linear displacement of the outer diameter of the wafer W. At the same time, in the $XO_1Y$ plane of the Cartesian coordinate system, the distance D between the center O and the center $O_1$ of the wafer W is the Y-axis coordinate value of the center O of the concentric circle.

In addition, it is to be noted that in the embodiments of the present disclosure, the position of the center O and the set reference scale line is set as an example in the $XO_1Y$ plane as shown in FIG. 4 and FIG. 5. In the $XO_1Y$ plane, if the center O is located on the right side of the reference scale line, then L>0; if the center O is located on the left side of the reference scale line, then L<0.

For the foregoing examples, specifically, referring to FIG. 6, when the center of the V-type notch is at a position I (indicated by the dashed concentric circle), in order to make the center of the V-type notch rotate to a target center position II (indicated by the double dotted line concentric circle), the rotation angle $\theta$ of the wafer W can be calculated by the foregoing formula $\theta=180L/\pi D$. It is to be understood that in order to make the center of the V-type notch coincide with the reference scale line, in FIG. 6, because L<0, it can be determined that the rotation direction of the wafer W is clockwise as defined in the embodiments of the present disclosure. That is, the servo motor 50 drives the wafer W to rotate clockwise by the rotation angle $\theta$, so that the center of the V-type notch is rotated to the target center position II, and finally makes the center of the V-type notch coincide with the reference scale line.

On the other hand, after driving the wafer W to rotate according to the rotation angle and rotation direction of the wafer W, the edge data of the V-type notch can be collected again by using the line laser contour detection sensor 30, and the steps S301 and S302 can be executed to ensure that the center of the V-type notch coincides with the reference scale line.

Figure 7:
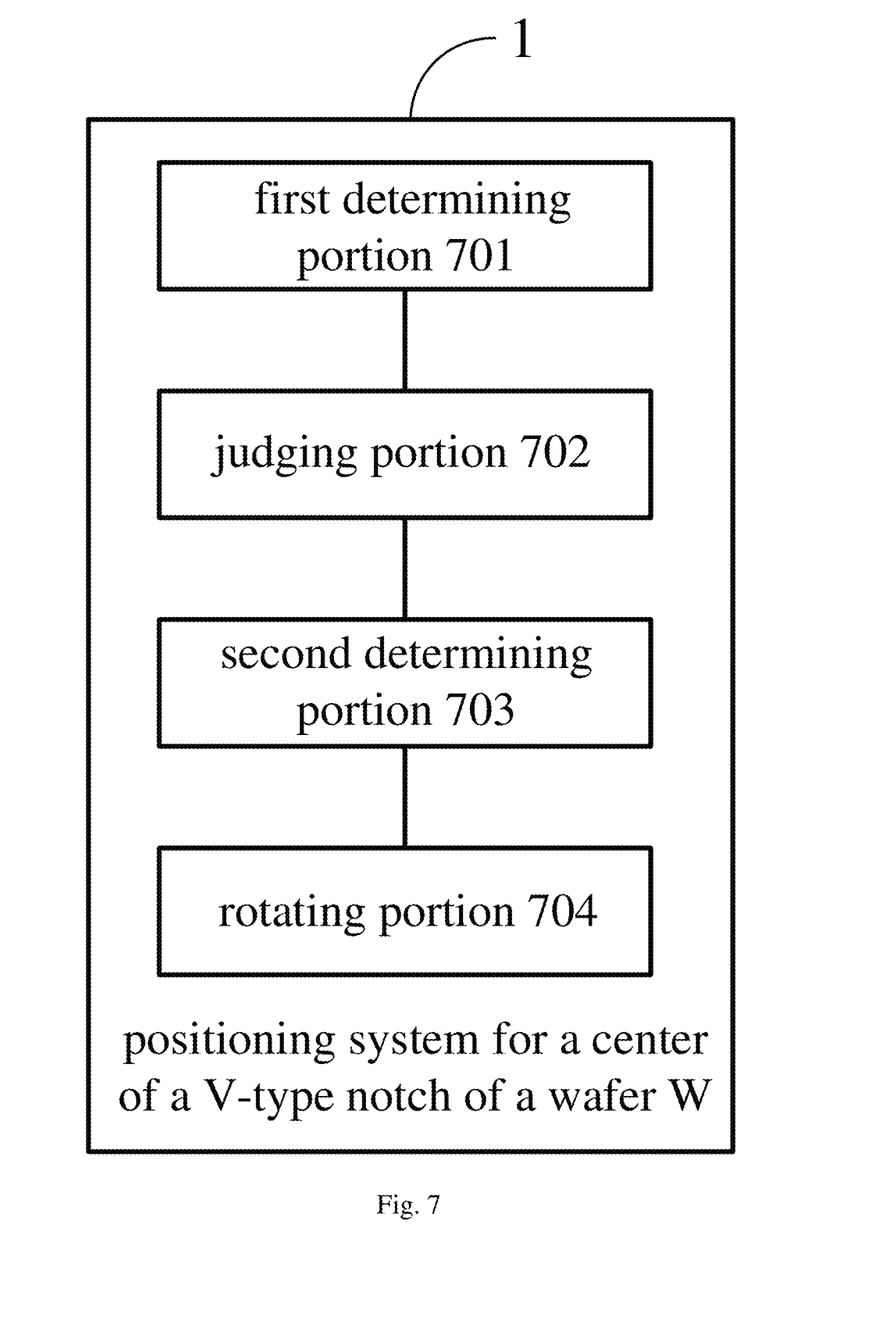
FIG. 7 is a schematic view of another positioning system for a center of a V-type notch of a wafer according to an embodiment of the present disclosure.

Based on the same conception as the foregoing technical solution, referring to FIG. 7, FIG. 7 shows a positioning system 1 for a center of a V-type notch of a wafer W according to an embodiment of the present disclosure. The system 1 comprises: a first determining portion 701, a judging portion 702, a second determining portion 703 and a rotating portion 704; wherein the first determining portion 701 is configured to determine, based on collected edge data of a V-type notch of a wafer W, a center of a concentric circle corresponding to edges of the V-type notch;

the judging portion 702 is configured to judge, based on a position relation between the center and a set reference scale line, whether the V-type notch is at a preset target center position;

the second determining portion 703 is configured to determine, based on the position relation between the center and the set reference scale line, a rotation direction and rotation angle of the wafer W when the V-type notch is out of the preset target center position;

the rotating portion 704 is configured to drive, according to the rotation direction and rotation angle of the wafer W, the wafer W to rotate so that the V-type notch is rotated to the preset target center position.

In the foregoing solutions, the first determining portion 701 is configured to:

rotate the wafer W so that the V-type notch is rotated to below a line laser contour detection sensor 30 (as shown in FIG. 1 and FIG. 2);

use the line laser contour detection sensor 30 to collect coordinates of each edge point of the V-type notch;

use a least squares method to obtain, based on the coordinates of each edge point, coordinate $(X_O, Y_O)$ of the center O of the concentric circle corresponding to the edge of the V-type notch.

In the foregoing solutions, the first determining portion 701 is configured to:

select three non-repeating edge points and using the least squares method to fit and obtain, based on the coordinates of the three non-repeating edge points, the coordinate $(X_O, Y_O)$ of the center O corresponding to the edge of the V-type notch.

In the foregoing solutions, the judging portion 702 is configured to:

obtain a distance L between the center O and the set reference scale line;

determine that the V-type notch is at the preset target center position when the distance L=0 or the distance L is within a preset range;

determine that the V-type notch is out of the preset target center position and continuing the positioning operation of the center of the V-type notch, when the distance L is without a preset range;

where the preset range is the distance L=0±0.001 mm between the center O of the concentric circle and the set reference scale line.

In the foregoing solutions, the second determining portion 703 is configured to:

determine, according to a formula θ=180L/πD, a rotation angle θ of the wafer W based on the distance L between the center O and the set reference scale line and the distance D between the center O and a center $O_1$ of the wafer W, when the V-type notch is out of the preset target center position;

determine, based on the position relation between the center O and the set reference scale line, the rotation direction of the wafer W.

In the foregoing solutions, the second determining portion 703 is configured to:

set, in an $XO_1Y$ plane of a Cartesian coordinate system, the distance L>0 when the center O is located on the right side of the reference scale line, the distance L<0 when the center O is located on the left side of the reference scale line:

determine that the rotation direction of the wafer W is counterclockwise when the distance L>0; or, determine that the rotation direction of the wafer W is clockwise when the distance L<0.

It is to be understood that, in the embodiment and other embodiments, "portion" may be portion of a circuit, portion of a processor, portion of a program or software and the like, of course, may also be a unit, and may also be modular and non-modular.

In addition, in this embodiment, various components may be integrated into a single processing unit, each unit can physically exist separately, or two or more units can be integrated into one unit. The integrated units mentioned above can be implemented in a hardware functional module or a software functional module.

If the integrated units are realized in the form of software function units and not sold or used as independent products, they may be stored in a computer-readable storage medium. Based on this understanding, the essence of the technical solution of the present disclosure or the part that contributes to the related art or the part of the technical solution may be embodied in the form of a software product. The computer software product is stored in a storage medium, includes several instructions which enables a computer device (which may be a personal computer, a server, or a network device, etc.) or a processor to execute all or part of the steps of the methods described in various embodiments of the present disclosure. The storage medium includes various media capable of storing program codes such as U disk, mobile hard disk, ROM, RAM, magnetic disk or optical disk.

Therefore, one embodiment of the present disclosure provides a computer storage medium, which comprises a program for positioning a center of a V-type notch of a wafer W. The program for positioning a center of a V-type notch of a wafer W is executed by at least one processor to perform the method for positioning a center of a V-type notch of a wafer W in above technical solutions.

Embodiments of the present disclosure provide a method and system for positioning a center of a V-type notch of a wafer, and computer storage medium. This positioning method determines a center of a concentric circle corresponding to edges of the V-type notch based on the collected edge data of the V-type notch, and judges whether the V-type notch is at the preset target center position based on the position relation between the center and the set reference scale line. When the V-type notch is out of the preset target center position, the rotation direction and rotation angle of the wafer are determined based on the position relation between the center and the set reference scale line, and the wafer is rotated according to the rotation direction and rotation angle of the wafer, until the V-type notch is rotated to the preset target center position. This method is able to reduce positioning errors, improve the accuracy of measurement results, save labor costs, and improve production efficiency.

It is to be noted that the technical solutions described in the embodiments of the present disclosure may be combined arbitrarily without conflict.

The above is only specific implementation of the disclosure, but the protection scope of the present disclosure is not limited to this. Those of ordinary skill in the art may make various variations under the teaching of this application without departing from the spirit of this application and the protection scope of the claims, and such variations all fall within the protection scope of this application. Therefore, the protection scope of the present disclosure should be based on the protection scope of the claims mentioned.

What is claimed is:

1. A method for positioning a center of a V-type notch of a wafer, comprising:

determining, based on collected edge data of the V-type notch of the wafer, a center of a concentric circle corresponding to edges of the V-type notch; wherein the determining, based on the collected edge data of the V-type notch of the wafer, the center of the concentric circle corresponding to the edges of the V-type notch comprises:

rotating the wafer until the V-type notch is rotated to below a line laser contour detection sensor;

using the line laser contour detection sensor to collect coordinates of each edge point of the V-type notch;

obtaining, based on the coordinates of each edge point, coordinate $(X_O, Y_O)$ of a center O of the concentric circle corresponding to the edges of the V-type notch by using least squares;

judging, based on a position relation between the center and a set reference scale line, whether the V-type notch is at a preset target center position; wherein the judging, based on the position relation between the center and the set reference scale line, whether the V-type notch is at a preset target center position, comprises:

obtaining a distance L between the center O and the set reference scale line;

determining that the V-type notch is at the preset target center position when the distance L=0 or the distance L is within a preset range;

determining that the V-type notch is out of the preset target center position and continuing positioning the center of the V-type notch, when the distance L is without a preset range;

wherein the preset range is the distance L=0±0.001 mm between the center O of the concentric circle and the set reference scale line;

determining, based on the position relation between the center and the set reference scale line, a rotation direction and rotation angle of the wafer, when the V-type notch is out of the preset target center position; and driving, according to the rotation direction and rotation angle of the wafer, the wafer to rotate until the V-type notch is rotated to the preset target center position.

2. The method according to claim 1, wherein the obtaining, based on the coordinates of each edge point, coordinates $(X_O, Y_O)$ of a center O of the concentric circle corresponding to the edges of the V-type notch by using least squares, comprising:

selecting three non-repeating edge points, and fitting and obtaining, based on the coordinates of the three non-repeating edge points, the coordinate $(X_O, Y_O)$ of the center O corresponding to the edges of the V-type notch by using the least squares.

3. The method according to claim 1, wherein the determining, based on the position relation between the center and the set reference scale line, the rotation direction and rotation angle of the wafer when the V-type notch is out of the preset target center position, comprises:

determining, according to a formula $\theta=180L/\pi D$, a rotation angle $\theta$ of the wafer based on the distance L between the center O and the set reference scale line and a distance D between the center O and a center $O_1$ of the wafer, when the V-type notch is out of the preset target center position;

determining, based on the position relation between the center O and the preset reference scale line, the rotation direction of the wafer.

4. The method according to claim 3, wherein the determining, based on the position relation between the center O and the set reference scale line, the rotation direction of the wafer, comprises:

setting, in an $XO_1Y$ plane of a Cartesian coordinate system, the distance L>0 when the center O is at a right side of the reference scale line, the distance L<0 when the center O is at a left side of the reference scale line;

determining that the rotation direction of the wafer is counterclockwise when the distance L>0; or, determining that the rotation direction of the wafer is clockwise when the distance L<0.

5. A computer storage medium, comprising a program for positioning a center of a V-type notch of a wafer stored thereon; wherein the program is executed by at least one processor to perform the method according to claim 1.

6. A positioning system for a center of a V-type notch of a wafer, comprising: a first determining portion, a judging portion, a second determining portion and a rotating portion; wherein the first determining portion is configured to determine, based on collected edge data of the V-type notch of the wafer, a center of a concentric circle corresponding to edges of the V-type notch; wherein determining, based on the collected edge data of the V-type notch of the wafer, the center of the concentric circle corresponding to the edges of the V-type notch comprises:

rotating the wafer until the V-type notch is rotated to below a line laser contour detection sensor;

using the line laser contour detection sensor to collect coordinates of each edge point of the V-type notch;

obtaining, based on the coordinates of each edge point, coordinate $(X_O, Y_O)$ of the center O of the concentric circle corresponding to the edge of the V-type notch by using least squares;

the judging portion is configured to judge, based on a position relation between the center and a set reference scale line, whether the V-type notch is at a preset target center position; wherein the judging, based on the position relation between the center and the set reference scale line, whether the V-type notch is at a preset target center position comprises:

obtaining a distance L between the center O and the preset reference scale line;

determining that the V-type notch is at the preset target center position when the distance L=0 or the distance L is within a preset range;

determining that the V-type notch is out of the preset target center position and continuing positioning the center of the V-type notch, when the distance L is without a preset range; wherein the preset range is the distance L=0±0.001 mm between the center O of the concentric circle and the set reference scale line;

the second determining portion is configured to determine, based on the position relation between the center and the set reference scale line, a rotation direction and rotation angle of the wafer when the V-type notch is out of the preset target center position;

the rotating portion is configured to drive, according to the rotation direction and rotation angle of the wafer, the wafer to rotate until the V-type notch is rotated to the preset target center position.

7. A system for positioning a center of a V-type notch of a wafer, comprising: a positioning back plate for positioning a wafer with the center of the V-type notch, a vacuum suction cup, a line laser contour detection sensor, a data processing device, and a servo motor; wherein the positioning back plate is provided with a circular hole that cooperates with the vacuum suction cup, and the vacuum suction cup is embedded in the circular hole;

the vacuum suction cup is used to adsorb the wafer with a back of the wafer tightly attached to the positioning back plate;

the line laser contour detection sensor is used to collect edge data of the V-type notch;

the data processing device is configured to:

determine, based on collected edge data of the V-type notch of the wafer, a center of a concentric circle corresponding to edges of the V-type notch; wherein the determining, based on the collected edge data of the V-type notch of the wafer, the center of the concentric circle corresponding to the edges of the V-type notch comprises:

rotating the wafer until the V-type notch is rotated to below a line laser contour detection sensor;

using the line laser contour detection sensor to collect coordinates of each edge point of the V-type notch;

obtaining, based on the coordinates of each edge point, coordinate $(X_O, Y_O)$ of the center O of the concentric circle corresponding to the edges of the V-type notch by using least squares;

judge, based on a position relation between the center and a set reference scale line, whether the V-type notch is at a preset target center position; wherein the judging, based on the position relation between the center and the set reference scale line, whether the V-type notch is at a preset target center position comprises:

obtaining a distance L between the center O and the preset reference scale line;

determining that the V-type notch is at the preset target center position when the distance L=0 or the distance L is within a preset range;

determining that the V-type notch is out of the preset target center position and continuing positioning the center of the V-type notch, when the distance L is without a preset range; wherein the preset range is the distance $L=0\pm0.001$ mm between the center O of the concentric circle and the set reference scale line;

determining, based on the position relation between the center and the set reference scale line, a rotation direction and rotation angle of the wafer when the V-type notch is out of the preset target center position; and, outputting, according to the rotation direction and rotation angle of the wafer, a control signal;

the servo motor is configured to drive the wafer to rotate clockwise or counterclockwise until the V-type notch is located below the line laser contour detection sensor; and drive, based on the control signal, the wafer to rotate according to the rotation direction and rotation angle of the wafer, until the V-type notch is rotated to the preset target center position.

\* \* \* \* \*